United States Patent [19]
Cereijo et al.

[11] 3,973,187
[45] Aug. 3, 1976

[54] SENSING CAPACITANCE AND THICKNESS OF INSULATED CABLE TO PROVIDE OUTPUTS RELATED TO WEIGH AND PERCENT VOIDS

[75] Inventors: Manuel Ramon Cereijo, Atlanta; Timothy Stephen Dougherty, Norcross, both of Ga.

[73] Assignee: Western Electric Company, Inc., New York, N.Y.

[22] Filed: June 2, 1975

[21] Appl. No.: 583,003

Related U.S. Application Data

[62] Division of Ser. No. 321,082, Jan. 4, 1973, Pat. No. 3,914,357.

[52] U.S. Cl. ................................. 324/61 R; 324/54
[51] Int. Cl.² ........................................ G01R 27/26
[58] Field of Search ................. 324/61 R, 61 P, 54; 264/40

[56] References Cited
UNITED STATES PATENTS

| | | | |
|---|---|---|---|
| 2,177,528 | 10/1939 | Kidd | 324/61 R |
| 2,765,441 | 10/1956 | Gambrill | 324/61 R |
| 3,355,664 | 11/1967 | Pranke | 324/54 X |

*Primary Examiner*—Stanley T. Krawczewicz
*Attorney, Agent, or Firm*—E. W. Somers

[57] ABSTRACT

The capacitance and diameter-over-dielectric of successive sections of a cellular plastic material are monitored continuously. The monitoring provides a continuous indication of the capacitance and the diameter with respect to the percent expansion of the cellular plastic material and the weight of the material per unit length of the conductor. This facilitates the regulation of process variables to maintain the capacitance and diameter-over-dielectric within acceptable ranges of values.

6 Claims, 23 Drawing Figures

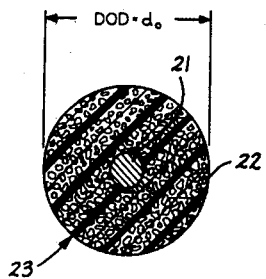
FIG. 1
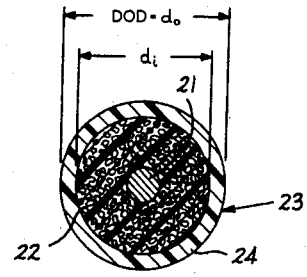
FIG. 2
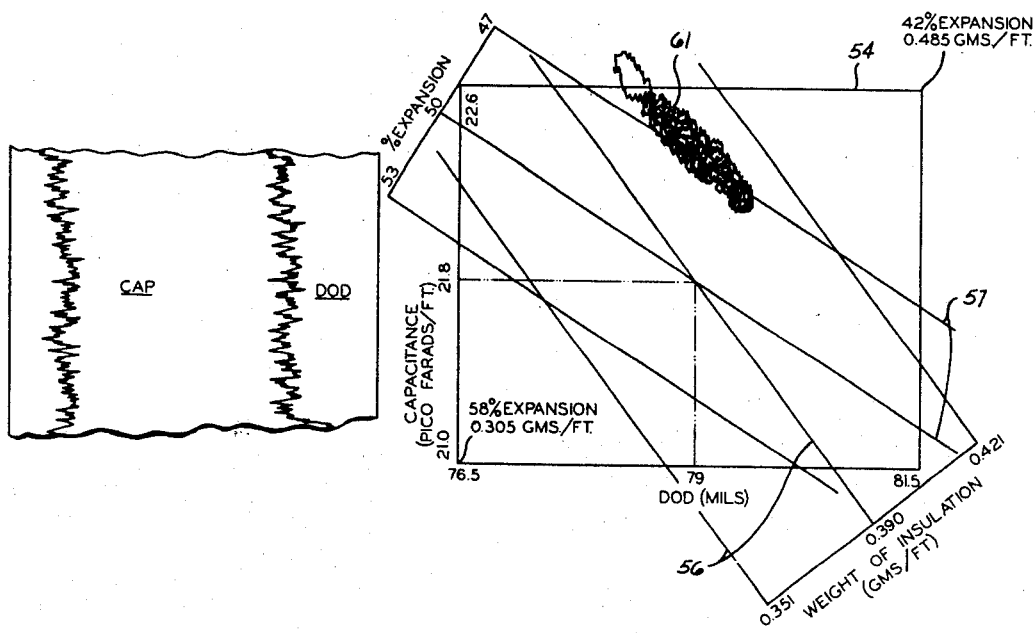
FIG. 4B
FIG. 4A

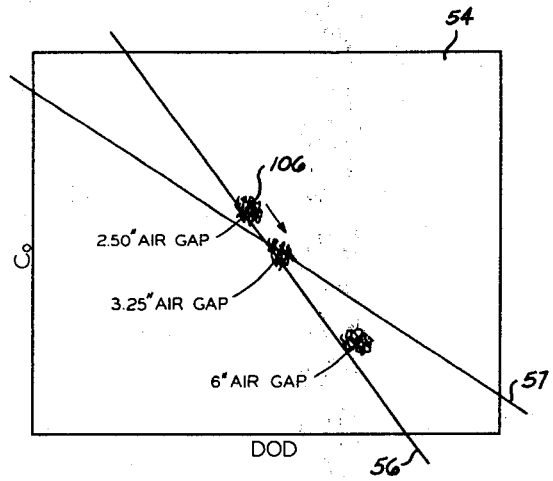
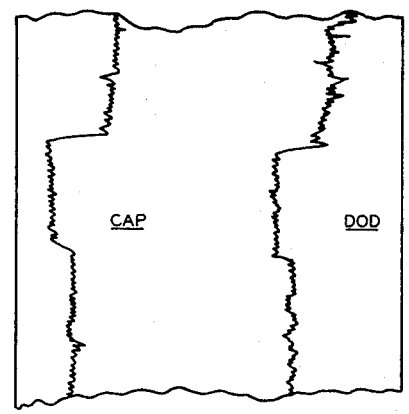
FIG. 18A
FIG. 18B
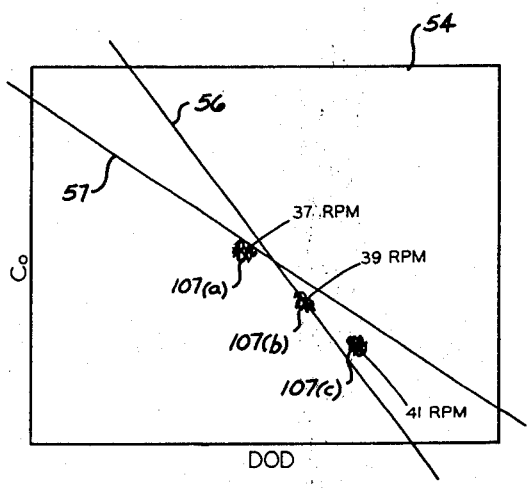
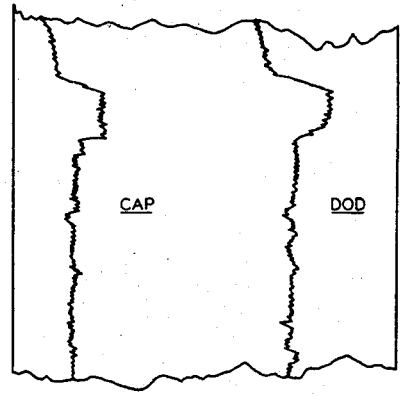
FIG. 19A
FIG. 19B

SENSING CAPACITANCE AND THICKNESS OF INSULATED CABLE TO PROVIDE OUTPUTS RELATED TO WEIGH AND PERCENT VOIDS

This is a division of application Ser. No. 321,082, filed Jan. 4, 1973, now U.S. Pat. No. 3,914,357 issued Oct. 21, 1975.

BACKGROUND OF THE INVENTION

This invention relates to monitoring cellular dielectric material and, more particularly, to methods of and apparatus for determining those adjustments to process variables which are necessary to maintain substantially at preselected values the capacitance and associated thickness of a cellular dielectric material.

TECHNICAL CONSIDERATION AND DISCUSSION OF PRIOR ART

Recently in the telephone communicatons industry, there has been a trend to replace air core cable with socalled filled cable in particular applications. In filled cable, the interstices of the core are filled with a waterproofing compound to prevent ingress of water into the core which affects the electrical characteristics of the cable. The replacement of the air in the interstices with waterproofing compound results in poorer dielectric properties. In order to compensate for this, the amount of insulation on each conductor must be increased. Although this method of construction is advantageous in preventing water damage, the crosssectional area of each of the conductors, as well as that of the core, is increased. This, of course, requires additional sheathing materials such as jacketing compound in order to properly cover the core.

In order to realize the advantages of filled cable and at the same time maintain the cost comparable to that of air core cable, efforts must be made toward reducing the size of the core. This may be accomplished advantageously by using dual insulation as a primary insulation for the individual conductors. Generally in dual insulated conductors, a cellular plastic insulation is extruded over and in engagement with the conductive element. Then a solid abrasion-resistant plastic material is extruded about the cellular plastic insulation to form a skin layer.

By using this construction for the individual conductors, it is possible to reduce the diameter of each of the conductors in filled cable to that which it was in air core cable. This is possible since the cellular plastic insulation has a lower dielectric constant than that of solid plastic insulation. The wall thickness of the cellular plastic insulation may be reduced over that of solid plastic insulation for a particular dielectric property. The net result then of the cellular plastic insulation plus the skin layer of solid plastic is an overall diameter in filled cable equivalent to that for solid plastic insulation in an air core cable.

Moreover, additional cost savings accrue because the presence of relatively large amounts of occluded gas in the cellular plastic insulation, e.g., 50 percent, minimizes the amount of plastic required. Solid plastic is replaced in part with voids which reduces the material cost. The reduction in conductor diameter leads to a core size for filled cable which approximates the size of the core in air core unfilled cable. And of course, costs are saved in the jacketing material in being able to maintain the core diameter at approximately the same size as for air core cable.

The prior art includes patents and publications relating to cellular plastic insulation. For example, see British patent No. 524,063, U.S. Pat. Nos. 2,848,739 and 3,020,248, an an article "Cellular Polyethylene by Extrusion" authored by W. T. Higgins and appearing at page 99 in the March, 1954 issue of Plastics Engineering.

While it is desirable to use cellular plastic insulation in conjunction with filled cable, there are certain problems which must be overcome. Although cellular plastic insulation has been known in the art for some time now, problems of process control may be responsible in part for the absence of widespread adoption to date. The processing of an extrudable plastic material containing an expanding medium to form a cellular plastic insulation is a sensitive manufacturing process. A parameter not encountered in the solid plastic insulation area, percent expansion, adds to the complexity of the process.

The problem of maintaining a predetermined uniform capacitance to ground of a cellular plastic insulated conductor is complicated by random variations in the composite dielectric constant of the insulation. These variations may result from changes in the degree of expansion of the cellular plastic insulation, which is affected by changes in the temperatures, pressures and other factors in the extrusion process.

In U.S. Pat. No. 2,765,441 issued Oct. 2, 1956 in the name of R. D. Gambrill, there is shown an apparatus for monitoring and extruding plastic materials. Facilities are provided for adjusting line speed to maintain a capacitance trace within acceptable limits. For example, if the capacitance decreases, then the line speed is increased to decrease the diameter-over-dielectric and hence to increase the capacitance.

It is also suggested in that patent that these facilities also control extrusion screw speed, temperatures and apparatus for controlling the degree of expansion. Methods and apparatus relating to the controlling of the percent expansion in cellular plastic insulation are also disclosed in an application Ser. No. 513,501 filed on June 6, 1955 in the name of G. E. Henning and now abandoned. Difficulties arise in determining which process variable to adjust in order to vary the percent expansion while maintaining diameter and capacitance within acceptable limits.

The prior art discloses methods and apparatus for altering process variables to control dimensions of multiple layers of solid insulation. For example, see U.S. Pat. Nos. 3,502,752 and 3,655,620.

In those patents, a graph of overall diameter versus capacitance is constructed with lines of constant inner diameter and lines of constant outer diameter superimposed thereon. A target or zero point which corresponds to nominal capacitance and diameter is also shown. A pointer is moved to a point having coordinates of capacitance and outside diameter. Since lines of constant inner diameter are plotted on the graph, the inner diameter can also be determined. The direction of the pointer indicates the source of deviation from the target point. Adjustments of the extruder pressure are then effected until the affected point is established in the vicinity of the target point.

It would be desirable to have a graph such as that used in the above identified patents which would be useful in the environment of cellular plastic insulation.

Departing from the prior art, the methods and apparatus of this invention are directed to monitoring the percent expansion to determine if the required degree of expansion is obtained and to control the cell structure. This is critical when using cellular plastic insulation. It is essential that the cellular plastic insulation have a multitude of small, discrete cells distributed uniformly throughout the bodies of plastic materials forming the insulative covering. If the percent expansion is too great, a cellular structure with interconnected voids occurs. This could permit the passage of moisture therethrough. Presently, the percent expansion is determined by an off-line test.

SUMMARY OF THE INVENTION

The invention provides methods of and apparatus for the monitoring of expanded cellular material in order to provide guidelines for the regulation of process variables to maintain parameters of the product within acceptable limits.

A method embodying the principles of the invention for monitoring an elongated cellular dielectric material includes the steps of advancing successive sections of the elongated material, measuring the capacitance and the associated thickness of the successive sections of the elongated material and generating a continuous indication of the measured capacitance and associated thickness of the successive sections of the elongated material with respect to the weight of insulation per length of elongated material and the percent of voids in the cellular material.

The percent expansion or the weight of the cellular material per length of elongated material or both the percent expansion and the weight may be regulated in accordance with the indication to maintain the thickness and the associated capacitance substantially at preselected values.

An apparatus embodying the principles of the invention for monitoring an elongated cellular dielectric material includes facilities for advancing successive sections of the elongated material, facilities for measuring the capacitance and associated thickness of the successive sections of the elongated material and facilities for generating a continuous indication of the measured capacitance and associated dielectric material of the successive sections of the elongated material with respect to the weight of dielectric material per length of elongated material and the percent of voids in the cellular material.

BRIEF DESCRIPTION OF THE DRAWINGS

Other objects and features of the present invention will be more readily understood from the following detailed description of specific embodiments thereof when read in conjunction with the accompanying drawings, in which:

FIG. 1 is a view of a conductive element having a single layer of cellular plastic insulation extruded thereabout;

FIG. 2 is a view of a conductive element insulated with an inner layer of cellular plastic insulation and an outer skin layer of solid plastic insulation;

FIG. 4A is a composite graph showing a typical plot of capacitance versus diameter-over-dielectric (DOD) under process conditions when applying a single layer cellular plastic insulation to successive sections of the conductive element;

FIG. 4B shows individual traces of capacitance and DOD for the process conditions of FIG. 4A;

FIG. 18A is a view of a capacitance and DOD trace and of these measured parameters in a composite with lines of constant output and percent expansion and showing the effect of a change in revolutions per minute of the extruder screw speed for dual insulation;

FIG. 18B shows individual capacitance and DOD traces associated with FIG. 17A;

FIG. 19A is a view of capacitance and DOD traces and of these measured parameters in a composite with lines of constant output and percent expansion for a dual insulated conductor and showing the effect of a change in the distance between the extruder die and the cooling trough; and FIG. 19B shows individual capacitance and DOD traces associated with FIG. 19A.

DETAILED DESCRIPTION

CELLULAR PLASTIC INSULATION

Figure 3:
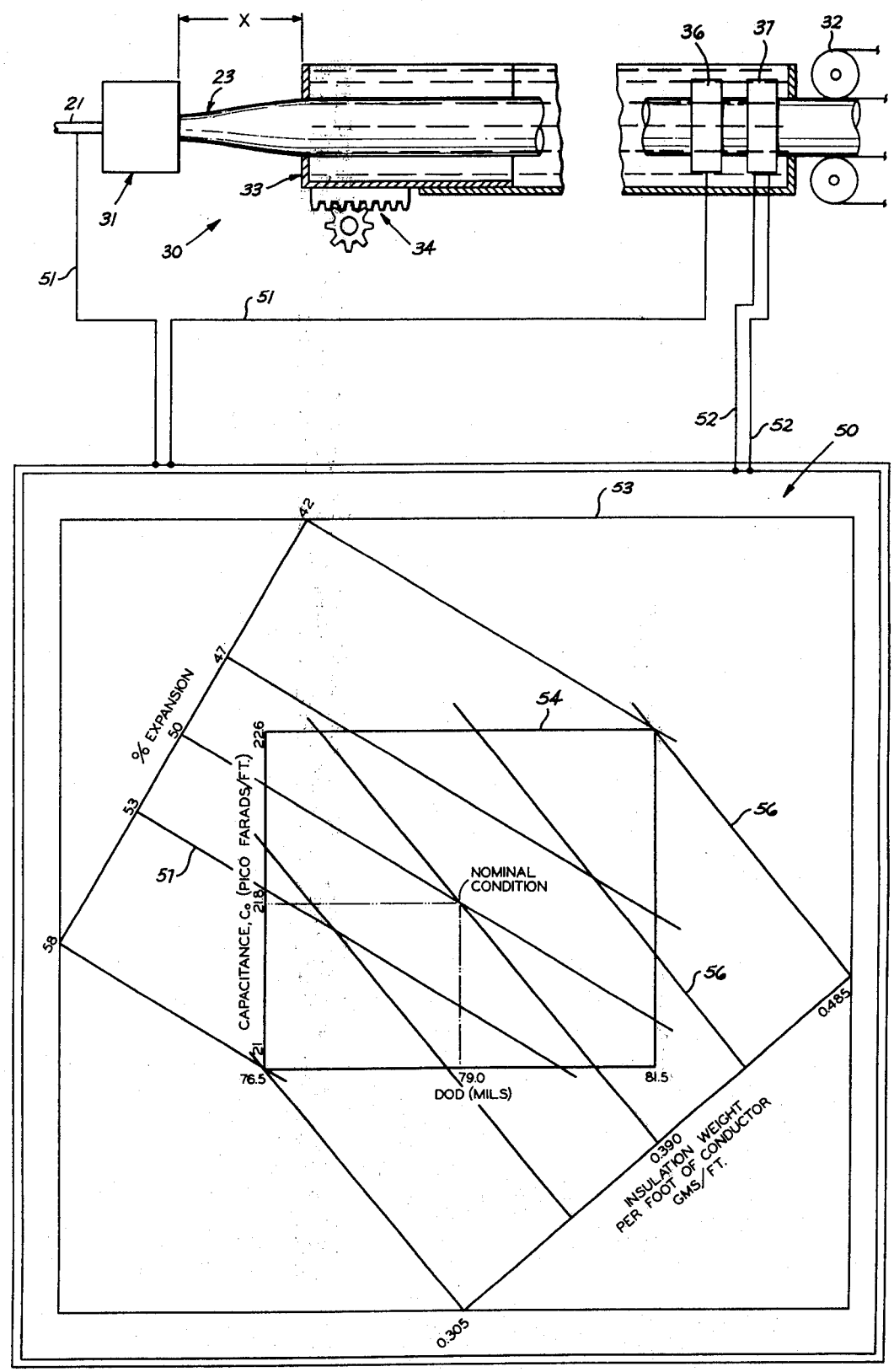
FIG. 3 is a view of an apparatus partially in section and in elevation and partially in schematic embodying the principles of this invention for applying a single layer of cellular plastic insulation to successive sections of the conductive element together with facilities for monitoring the application.

Successive sections of a conductive element 21 (see FIG. 1) may be advantageously insulated with cellular plastic insulation 22. The insulation material 22 has excellent dielectric properties and is less expensive than a solid plastic insulation.

Cellular plastic insulation is formed from a solid plastic material normally containing an admixed expanding medium. The resulting mixture is extruded about the conductive element 21 to form the insulative covering 22 having a cellular structure. The cellular structure includes desirably relatively small voids distributed uniformly throughout the insulation 22. Upon formation, the voids may contain carbon monoxide, but this generally decomposes with time leaving air-filled voids.

The use of the cellular plastic insulation material 22 is ideal for filled cable use in order to compensate for the loss of the dielectric properties of the air core while simultaneously reducing the cost of the insulation.

Referring now to FIG. 2, there is shown a dual insulated conductor 23 which includes the conductive element 21 having the layer 22 and a concentric layer 24 of plastic insulation thereabout. The inner layer 22 is formed preferably of cellular plastic, for example, polyethylene containing a multiplicity of minute blown cells distributed uniformly throughout. The outer layer 24, or skin as it is commonly designated, is preferably a solid plastic, for example, polyvinyl chloride (PVC) or polyethylene, which forms a protective jacket around the expanded cellular plastic layer 22.

The thin outer skin layer 24 imparts tough mechanical properties to the insulation, possesses better voltage breakdown characteristics, and provides a suitable material for color coding. Also, by having a solid plastic layer over the cellular layer, the permeability of the cable filling compound is reduced.

Alternatively, both of the layers 22 and 24 may be solid plastic; or the outer layer 24 may be cellular plastic over an inner layer 22 of solid plastic. Also, both layers may be of the same material, for example, high density polyethylene or polyproplene over expanded polyethylene or polypropylene, respectively.

While the principles of this invention are applicable to a single layer cellular plastic insulation or dual layer with the cellular plastic layer extruded over an inner solid plastic layer, it is undesirable for color coding purposes to have the cellular plastic as the outwardly facing layer. A pigment in the expanded insulation affects adversely the dielectric properties thereof and affects adversely the degree of expansion. Generally, the addition of a coloring pigment reduces the degree of expansion. Another problem is that different color pigments have different effects on the degree of expansion.

The conductor 21 may be formed of, for example, copper or aluminum, and may range in diameter from 16 to 45 mils. The outer diameter of the insulated conductor 23 varies between 30 and 80 mils. The wall thickness of the outer layer 24 may range between 2 and 5 mils.

The insulation on the insulated conductor 23 may be extruded onto the conductive element 21 by an apparatus designated generally by the numeral 30, such as that shown in FIG. 3. The following description of the methods and apparatus of this invention in conjuction with the apparatus 30 will assume that the conductive element 21 is being covered with either cellular plastic material 22 or with dual insulating layers comprising a solid plastic over expanded polyethylene. It should be understood that the methods and apparatus may be used for extruding both solid and expanded plastics and that the term "plastic" is intended to include both thermoplastic and thermosetting materials including rubber and rubber-like materials.

It should also be understood how the term "expansion" is to be interpreted in this specification. The percent expansion is interpreted to mean the percent of the cross sectional area which is comprised of voids. For example, 50% expansion is interpreted to mean that 50% of the cross-sectional area of the insulation is comprised of voids.

While it is desirable to use a cellular insulation in conjunction with filled cable, there are certain problems which must be overcome. The cellular plastic insulation process is a very sensitive manufacturing process. For example, the percent expansion must be controlled within predetermined limits. Moreover the formation of the cells or voids within the insulation should be uniformly distributed. Finally a certain number of nucleation centers must be preserved in order to obtain optimum expansion. Should the temperature in the extruder be excessive, the overheat will cause a substantial loss of the nucleation centers and lead to an undesirable pattern of expansion.

In using solid plastic insulation, the manufacturing process must be controlled to insure that two variables - diameter - over - dielectric (hereinafter referred to as DOD) and capacitance are within acceptable limits. If capacitance is determined, the DOD follows. This is not true when dealing with expanded cellular plastic insulation where the degree of expansion must be taken into account. When using solid plastic insulation, an operator need only look at a trace of DOD or capacitance. Only one parameter, extruder screw speed or line speed, need be adjusted in order to obtain desired capacitance and DOD.

In dealing with cellular plastic insulation, additional variables must be taken into account. The operator is confronted with confusing situations in a manufacturing environment of which process variables to adjust and to what degree in order to meet specification requirements for selected product characteristics. For example, extruder screw speed, barrel temperatures, line speed, wire temperatures and finally, the time during which expansion is permitted to occur all effect the resultant product. It would be most desirable to provide the operator with facilities for determining which of the parameters to adjust and to what extent.

The foregoing discussion is not intended to deter from the desirability of using cellular plastic insulation. Rather it is intended to illustrate how complex the process is when using this type of material.

OVERALL DESCRIPTION OF THE APPARATUS

Referring now to FIG. 3, there is shown the apparatus 30 for insulating successive sections of the conductive element 21 with either the single layer 22 of cellular insulation material or with the inner layer 22 cellular insulation enclosed with the skin layer 24 of solid plastic material.

The apparatus 30 includes an extruder 31 having a die (not shown) which is disclosed and claimed in copending application Ser. No. 288,648 filed Sept. 13, 1972 in the name of T. S. Dougherty. Successive sections of the conductive element 21 are advanced by a capstan 32 through the extruder 31 where the insulation 22 or the dual insulation layers 22 and 24 are applied.

An expanding medium such as azo-di-carbonamide is admixed with a solid plastic material. During the extrusion thereof onto the successive sections of the conductive element 21, the expanding medium decomposes under heat to release gas which goes into solution. It is desirable to have some of the expanding medium remain undecomposed until it reaches the die (not shown). Then through the action of the shear heat in the die, the remaining expanding medium is decomposed creating nucleating sites by releasing gas and heat. Clay or silica can also be used to cause nucleation. The gas in the material tends to migrate to the silica or the clay once the pressure is relieved.

Then the successive sections of the conductor 23 are advanced out of the extruder 31 and after a predetermined amount of travel, designated $x$, in the air into a cooling trough 33. The distance $x$ is commonly referred to in the art as the "air gap".

The extruded layer 22 of cellular plastic insulation increases in size immediately after leaving the extruder 31 due to the expansion of gases formed as a result of the decomposition of the blowing agent. Minute, distributed, discrete, gas-filled cells are formed throughout the sheath or layer 22 of insulation. Some of the air voids or bubbles may occur inside the extruder die (not shown) but desirably, all expansion should take place outside thereof. Then, when the successive sections of the dual insulated conductor 23 are advanced into the water trough 33, the cooling water "freezes" the skin layer 24 and the cooling of the inner layer 22 follows.

As can be seen in FIG. 3, the cooling trough 33 is mounted for movement reciprocally longitudinally of the path of travel of the conductor 23 by a gear and rack mechanism 34. In this way, the air gap, $x$, may be adjusted.

The amount of gas in solution and the number of nucleating sites are important parameters and are a function of extruder screw design and the temperature profile of the extruder 31. The temperture of each zone in the extruder 31 is important.

Another important variable is the distance $x$ from the extruder die (not shown) to the water trough 33. This parameter determines by how much the expanded cellular plastic insulation will be permitted to grow—the larger the air gap, the greater the percent expansion. The water trough 33 could, of course, be moveable reciprocally longitudinally of the line by a servo system (not shown) connected suitably to the gear and rack mechanism 34 and controlled by the monitoring facilities to be detailed hereafter. Care must be taken not to have an excessive air gap since that could create too large a cellular structure.

Another variable having relevance in the manufacture of cellular insulation is the bare wire temperature. Wire preheat permits expansion adjacent the conductive element. Wire preheat is a factor in the distribution of the expansion voids and the percent expansion.

The two in-line measurements of the successive sections of the conductor 26 are made near the downstream end of the cooling trough 33 (see FIG. 3). A capacitance monitor 36 measures the total capacitance of the insulation 22 or of the insulation layers 22 and 24 covering the conductive element 21. The capacitance monitor 36 may be of the type shown in U.S. Pat. Nos. 3,765,441 or 2,908,861 issued on Oct. 2, 1956 and Oct. 13, 1959, respectively, in the name of R. D. Gambrill or that shown in U.S. Pat. No. 2,804,592.

The overall diameter $d_o$ (see FIGS. 1 and 2) of the insulated conductor 23 is monitored continuously by a gauge 37. Typically this may include a roller (not shown) mounted rotatably on the end of an arm (not shown). The roller engages with the outwardly facing surface of the insulation and moves to shift the arm angularly in response to any changes in the overall diameter of the coated conductor 23. A typical commercially available underwater diameter gauge is that manufactured by the Beta Instrument Company and designated model no. TG1000 or TI500.

It must also be appreciated that the measurements of capacitance, C, and DOD must occur with respect to the same section of conductor. For example, capacitance is measured first, in the water trough whereas DOD is measured subsequently. Circuitry (not shown) may be devised to measure capacitance, then to store that measurement until the associated section of conductor 23 passes through the DOD measuring facilities. At that time, the DOD measurement is made and the corresponding capacitance signal released for simultaneous display.

Traces of the overall capacitance $C_o$ and the overall diameter $d_o$ are recorded as these parameters are customarily recorded with respect to single layer solid insulation. The measurement of these two parameters is also used to exercise control over the application of cellular plastic insulation to the conductive element 21.

MONITORING FACILITIES

The invention relates to the monitoring of the application of an insulative covering comprising one layer 22 of cellular plastic material to successive sections of the conductive element 21. The insulative covering may also include the skin or outer layer 24 of solid plastic insulation.

The invention provides the capabilities for generating a continuous indication of four selected product characteristics — capacitance, DOD, percent expansion and extruder output or weight of insulation per length of the conductor 23. These four variables may be used as inputs to auxiliary equipment (see FIG. 15) or may be advantageously displayed for use by an operator. This provides either for the auxiliary equipment or for an operator the advantageous correlation of product characteristics from which the adjustment of process variables follows. The dynamic indication of percent expansion is not taught in the prior art and is a useful tool for controlling the expansion of cellular plastics.

Controls are exercised over the percent expansion and the insulating weight per unit length of the conductor 23 to bring a trace of capacitance versus DOD to a nominal point. By controlling the weight of the extrudate, or output, and the percent expansion, the capacitance and the DOD are controlled indirectly.

The methods and apparatus of this invention may be used for single solid insulation, for single layer cellular plastic insulation, for dual expanded (one layer cellular and one layer solid) or for dual solid insulation. Of course, the greatest utility occurs when using a cellular plastic insulation.

In order to provide meaningful display of process variables, a coordinate chart-recording instrument 50 (see FIG. 3) is used. Such coordinate chart recording instruments are well known and a detailed description of such is not necessary for a complete understanding of this invention. An x-y recorder is available commercially from the Hewlett — Packard Company under the description, Model No. 7004B.

Both the capacitance monitor 36 and the DOD gauge 37 produce a direct current output voltage. The magnitude and the polarity of such voltages are dependent upon the magnitude and sign of deviations of the capacitance or the diameter of the conductor 23 from the desired values or zero point value. These output voltages are fed to the input of the chart-recording instrument 50 through conductors 51—51 from the capacitance monitor 36 and through conductors 52—52 from the DOD gauge 37.

The coordinate chart-recording instrument 50 has a recorder printer (not shown) which is moved up and down by the current from the capacitance monitor 36 and from side to side by the current from the DOD gauge 37. A chart 53 is inserted into the instrument for each reel (not shown) of the conductor 23. The chart 53 is drawn to such a scale that the incremental changes in capacitance and diameter indicated by the position of the recorder printer (not shown) are in direct correspondence with the incremental changes in capacitance and diameter indicated by the respective monitoring instruments 36 and 37.

Superimposed upon the chart 53 is an operating window or target area 54 which indicates the boundaries within which capacitance — DOD trace by the recorder — pointer (not shown) must fall to be within acceptable limits.

The operating window 54 shown in FIG. 3 represents a rectangular coordinate or x-y plot of acceptable values of capacitance and DOD for the insulated conductor 23. The values of capacitance, $C_o$, are plotted along the side or y-axis of the operating window 54, while the values of DOD are plotted along the base. Values of capacitance and DOD lying within the operating window 54 represent acceptable values. Of course, the nominal values most desirable occur at the center point of the operating window 54.

In order to maintain a capacitance-DOD trace for cellular plastic insulation within the operating window 54, the trace must be made with respect to product parameters which may be changed by known process variables. It has been determined that two product parameters, related to capacitance and DOD, which may be used for this purpose are weight of insulation per unit length of the conductor 23 and the percent expansion.

The weight of insulation of dual expanded plastic insulation is as follows:

$$W = \frac{\pi}{4}[(DOD - 2w)^2 - d^2]\rho_1 L(100\% - \% \text{ expansion of inner layer})$$
$$+ \frac{\pi}{4}[DOD^2 - (DOD - 2w)^2]\rho_2 L$$

Where
W = weight of insulation covering
L = length of conductor
DOD = diameter-over-dielectric
w = wall thickness of skin layer
d = diameter of conductive element 21
$\rho_1$ = density of base material of inner layer 22; and
$\rho_2$ = density of outer layer 24

In order to arrive at percent expansion, it is first necessary to consider the dielectric constant $\epsilon$. The dielectric constant for single layer expanded cellular insulation is given as:

$$\epsilon_{exp} = \frac{C_{coaxial} \text{Log}_{10} \frac{DOD}{d}}{7.36}$$

The dielectric constant for solid plastic insulation is known. However, for cellular insulation, the dielectric constant is not known. Fluctuations in the degree of expansion of the insulation cause corresponding changes in the composite dielectric constant of the insulation. Another factor which causes random variations in the dielectric constant of the insulation is non-uniformity in the distribution of gas cells throughout a cross section of the insulated conductor 23.

This equation also points up the complexity of dealing with cellular insulation. The equation includes three variables - coaxial capacitance, dielectric constant and DOD. The percent expansion can be expressed as a function of the dielectric constant; and the weight of the extrudate, W, is a function of DOD and percent expansion.

The dielectric constant of the expanded core of a dual layer expanded insulation is given as:

$$\epsilon_{exp} = \frac{C_{coaxial} \epsilon_{solid} \text{Log}_{10}\left(\frac{DOD-2w}{d}\right)}{7.36\epsilon_{solid} - C_{coaxial} \text{Log}_{10}\left(\frac{DOD}{DOD-2w}\right)}$$

From the values of dielectric constant given by the above equations, the percent expansion may be calculated by the following equation:

$$\% \text{ expansion} = \frac{K_1 - \sqrt{K_2 - K_3(\epsilon_{solid} - \epsilon_{exp})}}{K_4}$$

The last presented equation is derived empirically with the constants $K_1$ through $K_4$ having different values for different insulation materials.

It is known that the dielectric constant of plastic is in the range of 2.2 to 2.4 while that of air is 1.0. In a plot of percent expansion, as the abscissa ranging from 0 to 100 and the dielectric, $\epsilon$, as the ordinate ranging from 1.0 to 2.4, the curve is non-linear between the value of 2.4 on the y axis and 100 on the x axis.

From these equations, values of capacitance and DOD may be calculated for weight of insulation and for percent expansion. For constant values of weight and percent expansion, varying combinations of capacitance and DOD may be calculated. Then parallel lines 56—56 of constant weight of insulation, expressed in grams per foot of the conductor 23, and parallel lines 57—57 of constant percent expansion are superimposed on the operating window 54.

It should be realized that FIG. 3 depicts a display of constant output and constant percent expansion lines superimposed on a plot of capacitance versus DOD for single layer cellular plastic insulation. The slopes of these lines as well as their value will change for dual insulation comprising for example a solid skin layer over an expanded inner layer.

As can be seen from the chart 53 shown in FIG. 3, the line 57 of greatest percent expansion and that of least output of extrudate, insofar as those plotted, intersect with the point of least capacitance and least DOD. On the other hand, the lines 57 and 56 of least percent expansion and greatest output respectively, intersect with the point of greatest capacitance and greatest DOD. It can also be seen that the higher the DOD, the higher the insulation weight per unit length of the conductor 23.

The present invention has a wide range of applications. First, the invention applies to dual insulation, say solid over cellular plastic. Of course, a limiting situation here would be where the inner layer of cellular becomes solid. But, there may still be two different plastic layers, each with a different dielectric constant. The present invention applies also to a single layer cellular plastic insulation.

Finally, the present invention is applicable to single layer solid insulation in which the insulation is capable of having voids included therein. For example, when using high density polyethylene, the possibility exists that air bubbles may occur. When this occurs, the presence of the air bubbles may be accounted for by determining an equivalent precent expansion.

On the operating window 54 of acceptable values, there may be plotted a line (not shown) of zero percent expansion for say solid insulation, for example, high density polyethylene. This line extends from a large ordinate value of capacitance, linearly through the center of the rectangle and to the base or DOD scale. If a trace of DOD versus capacitance falls below this line, there is an indication that there is at least a bubble in the insulation.

It should be clear that the invention is directed to an insulation material capable of having at least an equivalent percent expansion.

Typically, the invention will involve the monitoring of the total capacitance Co and the overall diameter $d_o$ or DOD (see FIGS. 1 and 2) of an insulated conductor with a continuous indication thereof being conveniently displayed. The display is made in such a way that there is a continuous indication of four variables, not only capacitance and DOD, but also percent expansion and weight of insulation per foot of the conductor 23.

TYPICAL PROBLEM

Referring now to FIG. 4-A, there is shown a capacitance — DOD trace 61 on the operating window 54 for the conductor 23 covered with the single layer expanded cellular plastic insulation 22. Superimposed on the operating window 54 are the lines 57—57 of constant percent expansion and the lines 56—56 of constant output. The trace 61 has been obtained from actual operating conditions with a line speed of 1,000 feet per minute, and air gap, $x$, of 1-½ inches and a preheat temperature of 145° F.

From the individual capacitance and DOD traces related to this example and shown in FIG. 4B, it is seen that while the DOD trace is within acceptable limits, the capacitance trace is tending toward the upper limit of the acceptable range and will probably go outside the rectangle 54. It is further be observed from FIG. 4A that the trace 61 is essentially parallel to the lines 56—56 of constant output. This implies that variations in percent expansion are mostly responsible for the scatter in the trace 61 and that these slight variations may be caused by anuunsteady melting mechanism within the extruder 31.

If the operator merely had the conventional capacitance and DOD traces shown in FIG. 4B, it would be an almost impossible task to determine which process variables to adjust in order to bring the capacitance back to a nominal condition. But by using the principles of this invention, guides are provided for the operator so that by viewing the trace on the composite recorder instrument 50, he may make those adjustments required for correction.

In order to understand the rationale of making particular adjustments and the direction which these are to take under specific operating conditions, the effect of each of a plurality of process variables on product parameters, including percent expansion and insulation weight, will be discussed.

EFFECT OF PROCESS VARIABLES

The effect of changes of each of several process variables on the four parameters under consideration —capacitance, DOD, percent expansion and the insulation weight per unit length of the conductor 23 —will now be discussed. While the specific examples presented relate to single layer cellular plastic insulation, the effect of changes in the process variables will also be applicable to dual layer insulation.

There are two types of flow through the extruder die (not shown) pressure flow and drag flow. The colder the wire, the greater the tendency for the extrudate to solidfy onto the wire without expanding. A high degree of preheat on single layer expanded insulation leads to the creation of large voids. This is due to a tendency in the insulation to shrink away from the wire upon cooling. Hence, the preheat must be controlled in order to achieve a uniform cell structure.

Figure 5:
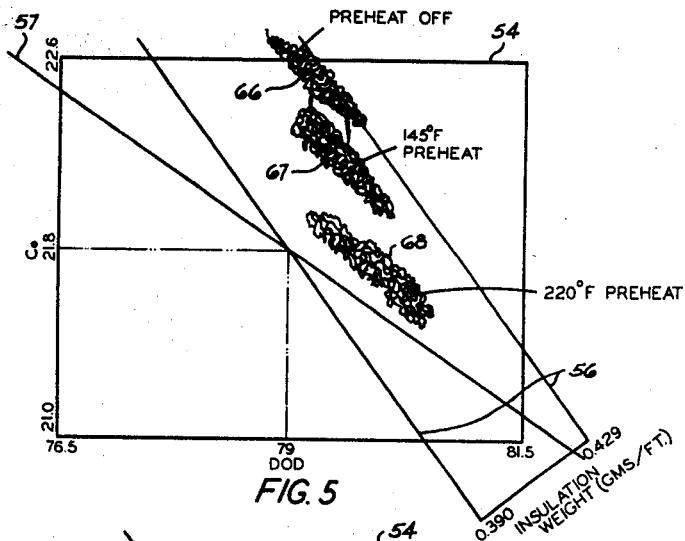
FIG. 5 is a graph depicting the effect of a change in conductor preheat on four selected product characteristics — capacitance, diameter-over-dielectric, extruder output and percent expansion, for a single layer of cellular plastic insulation.

The chart 54 in FIG. 5 shows capacitance-DOD traces 66, 67 and 68 for no preheat, 145° F. and 220° F. preheats, respectively. As can be seen from the composite in FIG. 5, as the preheat of the conductive element 21 increases, the percent expansion increases while the extruder output or insulation weight decreases. The output decreases because the increased preheat reduces the viscosity of the polymeric material in contact with the conductive element 21 and hence removes the drag flow effect from the conductive element. It is apparent from FIG. 5 that changes in preheat causes the capacitance - DOD trace to be moved almost vertically.

The amount of preheat cannot, however, be varied indiscriminately because of its effect on bubble distribution and insulation elongation. Often, the amount of preheat must be maintained at a high level to meet insulation elongationrequirement. But as was discussed hereinbefore, high preheat can cause large bubbles to be formed adjacent the wire especially in the thickerwalled insulations. Because of these limitations, preheat is not one of the most desirable control variables.

The temperature of the water in the cooling trough 33 is also a critical factor for solid and for cellular plastic insulation. Of course, the water temperature may always be maintained above that critical value at which no bubbles will result.

Figure 6:
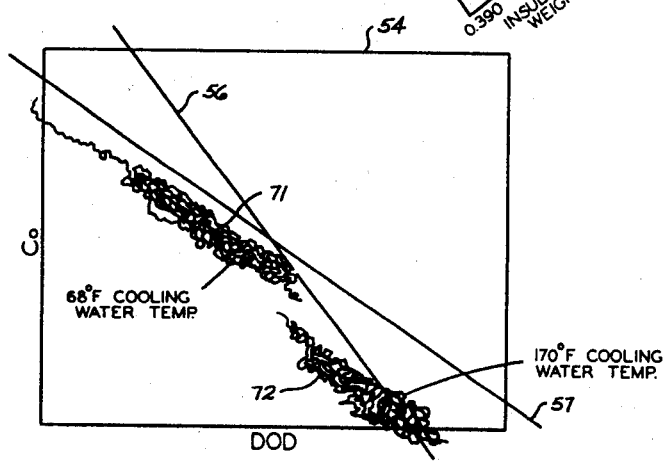
FIG. 6 is a graph showing the effect of a change in cooling water temperature on the four selected product characteristics of the cellular plastic insulated conductor.

As can be seen in FIG. 6, an increase in the temperature of the water in the cooling trough 33 causes a change from a capacitance - DOD trace 71 to a capacitance - DOD trace 72. This causes an increase in the percent expansion and a decrease in the insulation weight. However, for approximately a 100° F. change in cooling water temperature, the changes to percent expansion and insulation weight are slight.

Figure 7B:
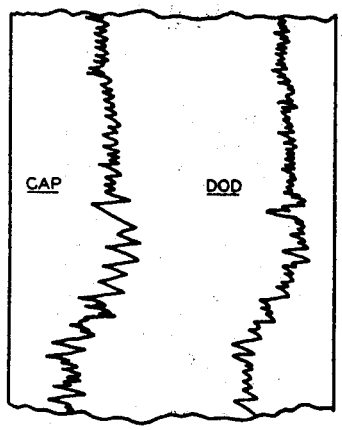
FIG. 7B shows individual capacitance and DOD traces associated with FIG. 7A.
Figure 7A:
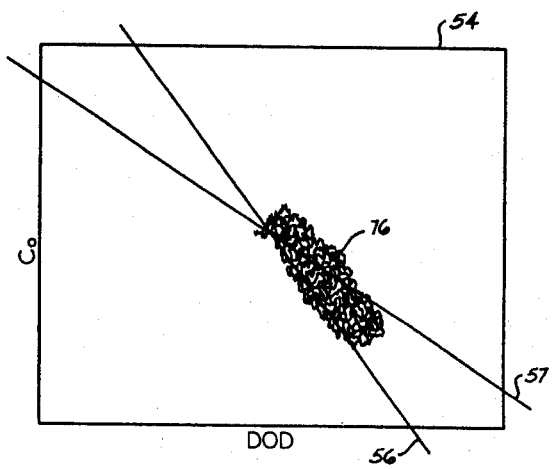
FIG. 7A is a graph showing the effect of the addition of a color pigment to the cellular plastic insulation.

The addition of pigments to foam or cellular plastic insulation has a deleterious effect. This can be seen in FIG. 7. The scatter in a trace 76 of capacitance 2 and DOD in FIG. 7A when adding color concentrate to the extrudate is quite pronounced. In comparison, the elimination of the color concentrate reduces the scatter substantially. This is apparent from a comparison of the upper and lower portions of the individual capacitance and DOD traces shown in FIG. 7B.

The degree of scatter is important in process control. When trying to operate within product specification, the less the scatter, the more quickly changes to process variables can be made, before the trace goes outside the operating window 54. Also, the greater the scatter, the more difficult it is to define the nominal operating condition.

Figure 8:
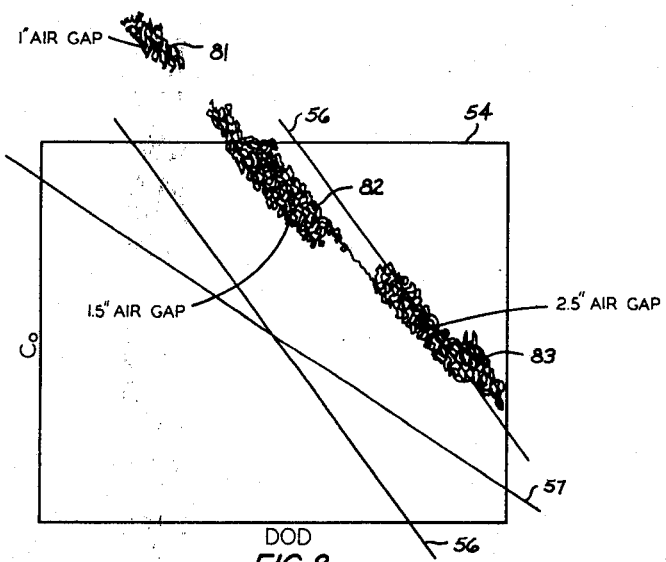
FIG. 8 is a graph showing the effects of a change in the distance between an extruder die and a cooling trough during the application of single layer cellular plastic insulation.

The effect of a change in the air gap, x, on capacitance, DOD, percent expansion and on extruder output is shown in FIG. 8. Capacitance - DOD traces 81, 82 and 83 appear to follow one of the lines 56—56 of constant insulation weight and appears to be substantially constant in slope. The positions of the traces 81–83 on the graph are a function of the particular cellular plastic insulation material being processed.

There are limitations on the amount of change which can reasonably be made in the air gap, x. An exceptionally large air gap may cause large voids, as well as pinholes, to be formed in the insulation and cause significant variations in capacitance and DOD.

A change in the air gap, x, is an effective way in which to control the percent expansion. As the mechanism 34 is controlled to move the cooling trough 33 closer to, or more distant from, the extruder 31, the change in percent expansion is immediate. This should be apparent from a consideration of FIG. 3 where it is seen that substantially all the growth of the cellular plastic insulation layer 72 occurs between the extruder die (not shown) and the cooling trough 33.

Figure 9:
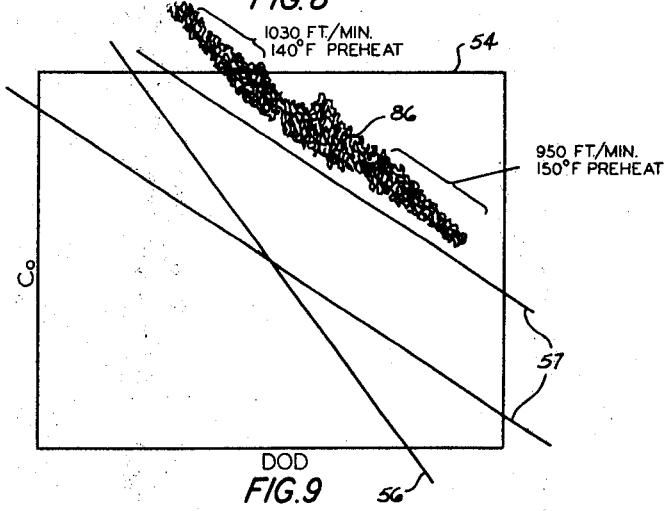
FIG. 9 is a graph showing the effect of changes in line speed on the four selected product characteristics for single layer cellular plastic insulation.

The effect of changes in line speed on capacitance, DOD, percent expansion and insulation weight is shown in FIG. 9. As is seen in that figure, changes to line speed cause a capacitance - DOD trace 86 to follow generally one of the lines 57—57 of constant percent expansion. Although the insulation weight is changed with changed line speed, the percent expansion appears substantially constant. This means that changes in line speed notwithstanding, the proportion of nucleating sites and the proportion of gas in solution is essentially constant.

If the line speed is changed, say increased, then the pressure in the extruder 31, is decreased thereby changing the shearing stresses in the extruder. Also, an increase in line speed will cause a decrease in the preheat temperature providing that no compensating changes are made at the wire preheater (not shown).

However, the line speed is not the most desirable process variable to change in order to vary the extruder output or the weight of insulation per foot of conductor 21. As the line speed is changed, the production rate is changed. It would be most desirable to change another process variable in order to vary extruder output.

Figure 10:
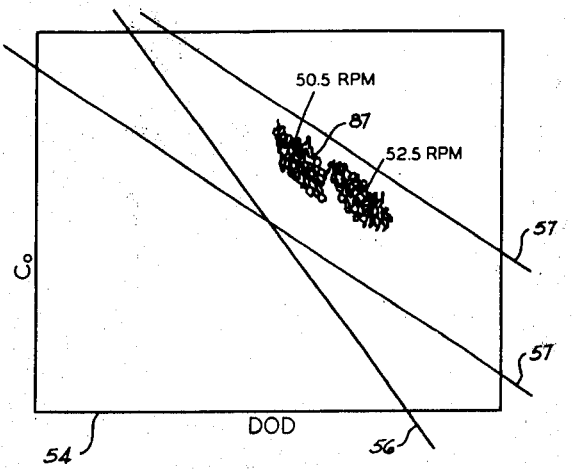
FIG. 10 is a graph showing the effect of changes in extruder screw speed on the four selected product characteristics for single layer cellular plastic insulation.

In order to change the weight of insulation per foot of conductor 23, the extruder screw speed may be changed. A change in screw speed changes the shear heat in the extruder 31. The effect of changes in the revolutions per minute of the extruder screw (not shown) is shown in FIG. 10. As can be seen, a capacitance - DOD trace 87 follows substantially a line of constant percent expansion.

It has been found more desirable to change the extruder screw speed (RPM) rather than line speed in order to change insulation weight output for at least two significant reasons. This is so first because as mentioned hereinabove, a change in line speed causes changes in the rate of production. Also, advantageously, small changes in RPM cause almost instantaneous changes in output to new steady state values with only small relatively insignificant thermal transient effects on percent expansion.

Figure 11:
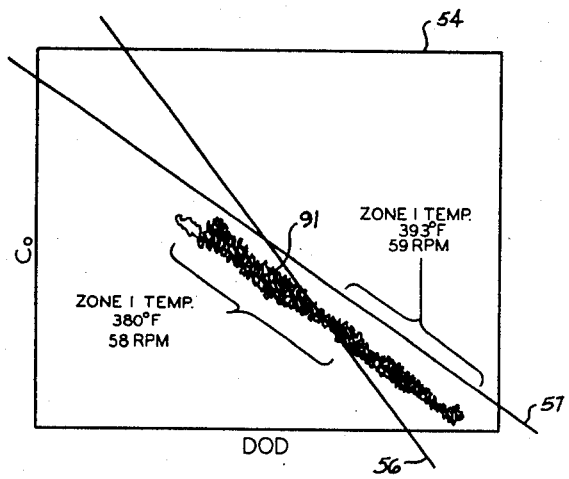
FIGS. 11–13 are a series of graphs showing the effect of a change in extruder temperature near a supply hopper, extruder temperature intermediate the supply hopper and the extruder die, and the extruder die temperature, on the four selected product characteristics with respect to the application of a single layer of cellular plastic insulation.
Figure 12:
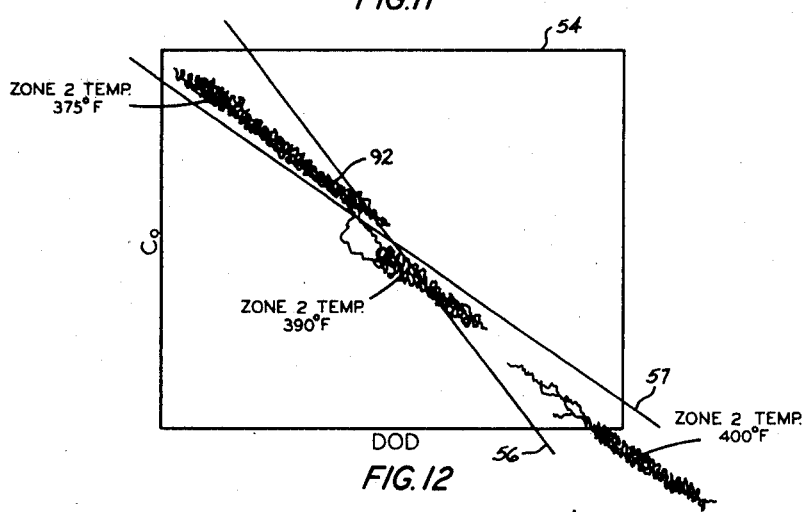
Figure 13:
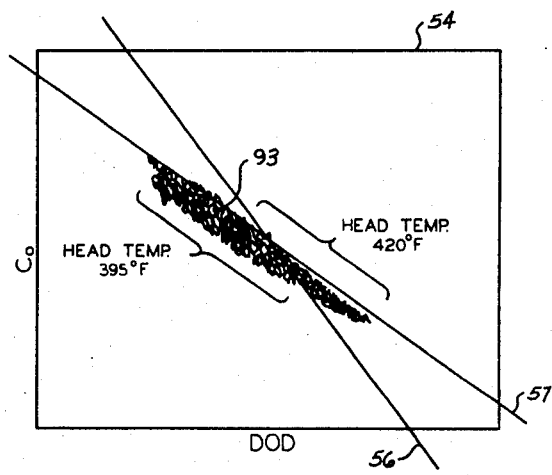

The next three figures, FIGS. 11-13, illustrate the effect of individual extruder barrel zone temperatures on the capacitance - DOD trace. A first zone controls the barrel temperature near a supply hopper (not shown) while a second zone is intermediate the supply hopper (not shown) and the extruder head (not shown).

The temperatures in the first zone and in the extruder head (not shown) are not effective in controlling capacitance and DOD as is evidenced by the slight shift in traces 91 and 93 in FIGS. 11 and 13 respectively, for large changes in temperature. The temperatures in the extruder barrel affect the percent expansion. However, the blowing agent in the expandable insulation material does not become active until a temperature in the range 27 of 380° to 400° F. is reached. If a change in the temperature of the first zone is made, there is a time interval before any effect is realized. It should be realized that in the dual extrusion under consideration that there is a vertical extruder and a horizontal extruder and that the barrel temperatures are those in that extruder which extrudes the expanded cellular plastic layer. There is also not much change for a change in the head temperature. This is so because of the low volume of material being moved through this zone and the material being moved therethrough at a high rate of speed.

Control of the second or final barrel temperature zone has proven to be the most effective way of changing capacitance and DOD by way of a temperature change. As can be seen by a trace 92 in FIG. 12, as the temperature is increased, the output generally is increased. This may not always be true since very high barrel temperatures cause the loss of nucleation sites and hence an accompanying loss in expansion and accompanying creation of voids.

Again it must be emphasized that the use of cellular plastic insulation introduces a new dimension into the package of process variables, i.e., percent expansion. Whereas in the past, the achievement of a goal capacitance meant that DOD was also achieved or vice versa, this is no longer true necessarily when using expanded insulation.

In solid plastic insulation, an operator need only have changed extruder screw speed to obtain the desired diameter over dielectric which meant that a proper capacitance would also be obtained. When using cellular plastic insulation, the operator still sees a capacitance and DOD trace, but now cannot simply determine which variables to change in order to shift the trace within acceptable limits.

The principles of this invention may be employed to change those process variables most expeditious for effecting desired variations in properties of the final insulated conductor 23. A continuous indication of capacitance and diameter with respect to percent expansion and insulation weight may be generated. This information may either be displayed visually for operator use or used as inputs to a system for controlling automatically process variables e.g., air gap.

Figure 14:
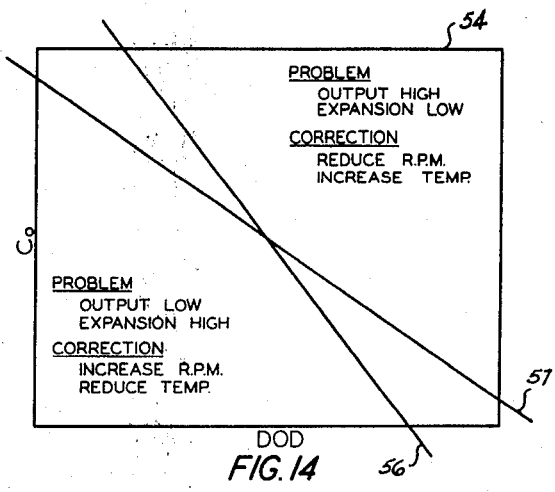
FIG. 14 is a view of a diagnostic device which may be given an operator in a manufacturing facility to control a cellular plastic insulation process.

When used as an operator aid, this information may be displayed on a diagnostic device such as that shown in FIG. 14. A line 56 of constant output and a line 57 of constant percent expansion which intersect with the point representing nominal capacitance and DOD are plotted. Then, depending on where the capacitance - DOD trace appears, the operator can quickly determine which process variables he should adjust.

It should also be realized that while the chart recording instrument 50 is designed to plot a composite of capacitance versus DOD with lines of constant percent expansion and insulation weight superimposed thereon, the invention is not so limited. For example, it is within the scope of this invention to measure capacitance and DOD and to plot continuously computed values of percent expansion and insulation weight amidst superimposed lines of constant capacitance and lines of constant DOD.

FEEDBACK CONTROL SYSTEM

Figure 15:
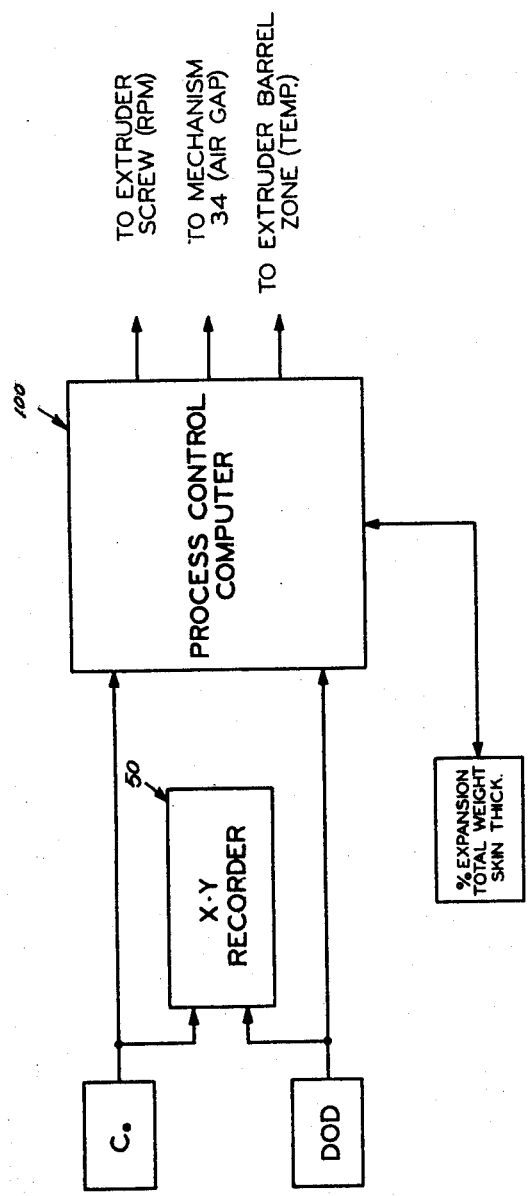
FIG. 15 is a schematic view of a system in which the principles of this invention may be used in a feedback control system to automatically adjust process variables.

Referring now to FIG. 15, it is seen how the principles of this invention may be extended to a feedback control system to automatically control the process variables. As before, the capacitance and the DOD are measured by the capacitance monitor 36 and the gauge 37, respectively. These measurements are supplied as inputs to the x-y recorder 50 and as inputs to a process control computer, designated generally by the numeral 100.

The inputs to the computer 100 are proportional to the deviation from the nominal values as determined by process specifications. The inputs cause built-in logic of the computer 100 to establish required correctional signals. These correctional signals are used to vary, for example, the extruder screw speed or to control the mechanism 34 to move the cooling trough 33 and adjust the air gap.

The process control computer 100 includes a built in coordinate plotter which may be in terms of a Cartesian or other convenient coordinate system. In this way, a trace of capacitance and DOD is reviewed with respect to lines of constant percent expansion and insulation weight which are programmed into the computer by using the equations presented hereinbefore.

The x-y chart-recording instrument 50 may also be used in conjunction with the process control computer 100. In this way, the operator may observe visually the process conditions and correctional moves made by the computer 100.

EXAMPLE 1

Figure 16:
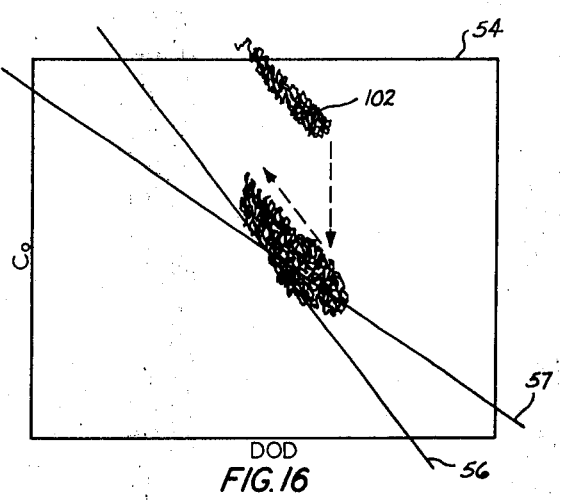
FIG. 16 is a graph showing how the principles of this invention may be applied to bring capacitance - DOD traces for a single layer cellular plastic insulation back toward a nominal condition.

Referring now to FIG. 16, there is shown a capacitance - DOD trace 102 for a preheat of 150° F. and an extruder screw speed of 54 RPM. This display will be used to discuss how the operator may make changes to the process variables in an intelligent fashion rather than on a trial basis. It is understood, of course, that the inputs to the capacitance - DOD display may be used as inputs to a servo-control system which may be used to control automatically the process variables.

As is seen in FIG. 16, the capacitance - DOD trace 102 is near the upper limit of acceptable capacitance values thus necessitating a vertical shift in a downward direction. In a first step of a corrective procedure, the preheat temperature was increased until the trace fell on the line 57 of constant percent expansion passing through the nominal condition. Then the RPM of the extruder screw was reduced to move the trace 102 along the line of constant percent expansion to the nominal point of insulation weight.

EXAMPLE 2

Figure 17:
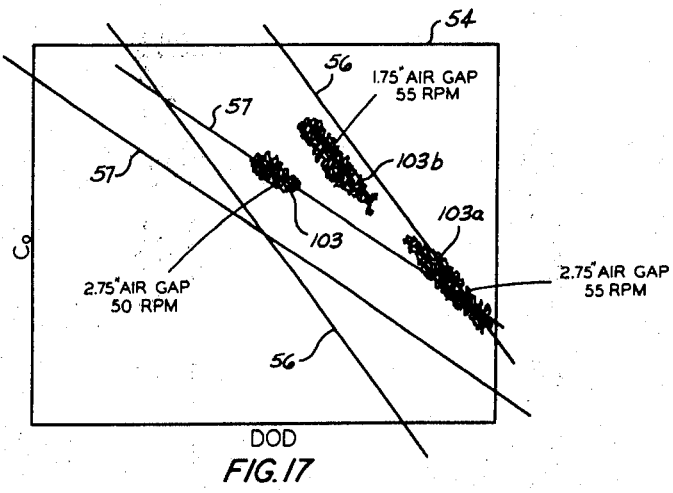
FIG. 17 is a graph showing te effects of process variables on product characteristics.

Referring now to FIG. 17, there is shown another capacitance - DOD trace 103 which is removed from the nominal condition at the center of the operating window 54. The trace 103 is made under operating conditions which include initially an extruder screw speed of 50 RPM and an air gap of 2.75 inches. The composite is intended to show the effect of changes in RPM and air gap or the four selected product characteristics.

If the air gap is held constant at 2.75 inches and the RPM of the extruder screw is increased to 55 RPM, the trace 103 moves along the line 57 of constant 50% expansion to the position designated 103a. Then, if the RPM is held constant and the air gap decreased from 2.75 inches to 1.75 inches, the trace moves along the line 56 of constant insulation weight to a position designated 103b.

MONITORING DUAL INSULATION

It should be realized that the output of the extruder 31 for the skin layer 24 does not affect the output for the inner cellular layer 22. Moreover, the thickness of the outer layer 24 is essentially constant.

When using the present invention for dual insulation, solid plastic over cellular plastic, it is assumed that the skin thickness $(d_o-d_i)/2$ is constant and known. The skin thickness may be measured off-line or by a separate in-line monitor. This is not an overly unrealistic assumption. For example, assume a three mil skin thickness and a 73 mil diameter of expanded insulation and a constant extruder output. The smallest detectable change in wall thickness is ½ mil. With a constant output of extrudute for the outer layer, a drop of skin thickness from 3 to 2.5 mils would require that the diameter of the cellular insulation increase to 96 mils. This is a highly unlikely occurence.

Also the dielectric constant of the plastic insulation material may be determined. From instrumentation on the line, the overall capacitance of the dual insulation and the overall diameter of the successive sections of the dual insulated conductor 23 are measured. This leaves two unknowns, percent expansion of the inner layer and total insulation weight per foot of the conductor 23. The total weight includes the weight of the cellular insulation together with the weight of the solid insulation.

As can be observed from a comparison of FIGS. 18 and 19 with FIGS 5–13, there is less scatter on a trace for dual insulation than for single layer cellular insulation. This occurs because the skin or outer layer 24 tends to mitigate against the expansion. This results in being able to more quickly compensate for changes before the capacitance - DOD trace drifts out of the operating window 54 of acceptable values. Hence, the reduction in scatter gives much better control over the process.

Referring now to FIG. 18, as the air gap is increased, a capacitance - DOD trace 106 moves generally along the line 56 of nominal output. The percent expansion increases and the cross section increases. As the cross section of the conductor 23 for single layer cellular insulation gets larger and larger, some of the gas leaks out and the cross section may deflate. This only occurs for single layer cellular insulation. The skin layer 24 in dual insulation prevents this leakage.

Referring now to FIG. 19, there is shown a trace 107 of capacitance and DOD in a composite with a line of 53 percent expansion, and a nominal constant output of 0.450 gram per foot. The skin layer 24 is 4 mils thick. As can be seen by the traces labelled 107a, 107b and 107c, changes in the speed of the extruder screw (not shown) causes a change in the extruder output, going from one side of the line 50 of constant nominal insulation weight, into engagement with the line and then to the other side thereof.

It should be realized that while the Detailed Description is couched in terms of insulating successive sections of the conductive element 21 with at least a layer of cellular plastic insulation material, the invention is not so limited. For example, the invention relates to the simultaneous display of four variables, one of which is percent expansion. This permits the principles of the invention to be used in monitoring an elongated cellular material in perhaps strip form. Subsequently, the strip could be wrapped about successive sections of another elongated member. Or the strip could be laminated with another material which is then wrapped about an elongated member.

Moreover, the cellular insulation or cellular material need not be cellular plastic material. The cellular material could be a cellular pulp material or other cellular dielectric material.

In these environments, facilities are provided for measuring the capacitance of the insulation or cellular dielectric material. Then the associated thickness of the insulation or cellular dielectric material is measured. The capacitance and associated thickness are indicated with respect to insulation weight and percent expansion.

It is to be understood that the above-described arrangements are simply illustrative of the principles of the invention. Other arrangements may be devised by those skilled in the art which will embody the principles of the invention and fall within the spirit and scope thereof.

What is claimed is:

1. A method of monitoring an elongated dielectric material including at least a cellular dielectric material, which includes the steps of:
    advancing an elongated dielectric material which includes at least a layer of a cellular dielectric material;
    measuring the capacitance and the associated thickness of the elongated dielectric material;
    generating electrical signals related to the measured capacitance and associated thickness of the elongated dielectric material and transforming these signals into other signals related to the weight of the dielectric material per unit length and the percent of voids in the cellular dielectric material.

2. An apparatus for monitoring an elongated dielectric material including at least a cellular dielectric material, which includes:
    means for advancing an elongated dielectric material;
    means for measuring the capacitance and the associated thickness of the elongated dielectric material; and
    means for generating electrical signals related to the measured capacitance and associated thickness of the elongated material; and
    means for transforming the electrical signals into other signals related to the weight of insulation per length of elongated material and the percent of voids in the cellular dielectric material.

3. A method of monitoring an elongated dielectric material including at least a cellular dielectric material, including the steps of:
    advancing an elongated dielectric material which includes at least a layer of a cellular dielectric material;
    measuring the capacitance and associated thickness of the elongated material;
    generating electrical signals related to the measured capacitance and associated thickness of the elongated material; and
    displaying the signals while relating the displayed signals to the weight of the elongated material per unit length and the percent voids of the cellular dielectric material.

4. A method of monitoring an elongated dielectric material, which includes a layer of material capable of having at least an equivalent percent expansion, which includes the steps of:
    advancing an elongated dielectric material which includes a layer of material capable of having at least an equivalent percent expansion;
    displaying lines of constant insulation weight per unit length of the elongated material and lines of constant percent expansion on a coordinate trace of capacitance versus breadth of the outwardly facing surface of the elongated material;
    measuring the capacitance and the associated breadth of the elongated dielectric material;
    generating electrical signals related to the measured capacitance and the associated breadth of the elongated material; and
    causing an indicator to be moved by the signal to be displayed continuously on the trace to transform the capacitance and breadth into the unit length weight and the at least equivalent percent expansion.

5. An apparatus for monitoring an elongated dielectric material including at least a cellular dielectric material, which includes:
    means for advancing an elongated dielectric material including at least a layer of a cellular dielectric material,
    means for measuring the capacitance and associated thickness of the elongated material;
    means for generating electrical signals related to the measured capacitance and associated thickness of the elongated material; and
    means for displaying the signals while relating the displayed signals to the weight of the elongated dielectric material per unit length and the percent voids of the cellular dielectric material.

6. An apparatus for monitoring an elongated dielectric material, which includes a layer of material capable of having at least an equivalent percent expansion, which includes:

means for advancing an elongated dielectric material which includes a layer of material capable of having at least an equivalent percent expansion;

means for displaying lines of constant insulation weight per unit length of the elongated material and lines of constant percent expansion on a coordinate trace of capacitance versus breadth of the outwardly facing surface of the elongated material;

means for measuring the capacitance and the associated breadth of the elongated dielectric material;

means for generating electrical signals related to the measured capacitance and the associated breadth of the elongated material; and means for causing an indicator to be moved by the signal to be displayed continuously on the trace to transform the capacitance and breadth into the unit length weight and the at least equivalent percent expansion.

* * * * *